United States Patent
Christophy et al.

(10) Patent No.: US 9,489,019 B2
(45) Date of Patent: Nov. 8, 2016

(54) ELECTROSTATIC DISCHARGE PROTECTION IN CONSUMER ELECTRONIC PRODUCTS

(71) Applicant: Apple Inc., Cupertino, CA (US)

(72) Inventors: Miguel C. Christophy, San Francisco, CA (US); Silvio Grespan, Santa Clara, CA (US); Richard Hung Minh Dinh, Saratoga, CA (US); John O. Ceideburg, Santa Cruz, CA (US); Kingsuk Brahma, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 31 days.

(21) Appl. No.: 14/293,998

(22) Filed: Jun. 2, 2014

(65) Prior Publication Data

US 2015/0070622 A1 Mar. 12, 2015

Related U.S. Application Data

(60) Provisional application No. 61/875,613, filed on Sep. 9, 2013.

(51) Int. Cl.
| | |
|---|---|
| *G02F 1/1333* | (2006.01) |
| *G06F 1/18* | (2006.01) |
| *G06F 1/16* | (2006.01) |
| *H05K 9/00* | (2006.01) |

(52) U.S. Cl.
CPC .............. *G06F 1/182* (2013.01); *G06F 1/1656* (2013.01); *H05K 9/0067* (2013.01); *G02F 1/133308* (2013.01); *G02F 2201/50* (2013.01)

(58) Field of Classification Search
CPC ............. G02F 1/133308; G02F 2001/133334; G02F 2001/133317; G02F 1/1333; G02F 2201/50; H05K 9/0067; G06F 1/182; G06F 1/1656

USPC ...................................................... 349/58–59
See application file for complete search history.

(56) References Cited

U.S. PATENT DOCUMENTS

| | | | |
|---|---|---|---|
| 6,728,555 B1 * | 4/2004 | Pirila .................. | H04M 1/0202 361/816 |
| 7,495,895 B2 | 2/2009 | Carnevali | |
| 8,144,026 B2 | 3/2012 | Yan | |
| 2005/0052582 A1 * | 3/2005 | Mai ..................... | G02F 1/13338 349/12 |
| 2011/0285640 A1 * | 11/2011 | Park .................... | G02F 1/13338 345/173 |
| 2012/0062511 A1 | 3/2012 | Ishizaki et al. | |
| 2013/0083275 A1 * | 4/2013 | Al ...................... | G02F 1/133308 349/106 |
| 2013/0329171 A1 | 12/2013 | Xu et al. | |
| 2013/0329460 A1 | 12/2013 | Mathew et al. | |
| 2014/0078419 A1 | 3/2014 | Lin et al. | |
| 2014/0368749 A1 * | 12/2014 | Alonso .............. | G02F 1/13338 349/12 |

* cited by examiner

*Primary Examiner* — Nathanael R Briggs
(74) *Attorney, Agent, or Firm* — Downey Brand LLP (57) ABSTRACT

An electrostatic discharge (ESD) blocking component is set forth for a computing device. The computing device can include a housing formed of non-conducting material and an overlaying display assembly supported by the housing. The display assembly can further include a plurality of display elements such as thin film transistors (TFTs) interconnected by corresponding metallic traces. The ESD block is used to block static charges associated with an ESD event so that essentially no ESD event related static charge is accumulated on the metallic traces thereby preventing ESD related damage to the plurality of TFTs.

20 Claims, 8 Drawing Sheets

ELECTROSTATIC DISCHARGE PROTECTION IN CONSUMER ELECTRONIC PRODUCTS

CROSS-REFERENCE TO RELATED APPLICATIONS

The present application claims the benefit of U.S. Provisional Application No. 61/875,613, entitled "ESD PROTECTION IN CONSUMER ELECTRONIC PRODUCTS" filed Sep. 9, 2013, the content of which is incorporated herein by reference in its entirety for all purposes.

FIELD

The described embodiments relate generally to consumer electronic products and more particularly to preventing damage to circuits within the consumer electronic product caused by electrostatic discharge events.

BACKGROUND

In recent years, small form factor computing devices such as media players and cellular phones have become smaller and lighter, while incorporating more powerful operating components into densely packed configurations. This reduction in size and increase in density can be attributed in part to a manufacturer's ability to fabricate various operational components such as processors and memory devices in more compact configurations. However, this trend to smaller size and increase in component density poses a number of continuing design and challenges related to durability.

For example, small form factor computing devices, such as mobile phones, can be randomly subject to electrical shock from static electricity. Because of their compact size, even a small shock can do extensive damage considering the size and volatility of many of the electrical components inside the computing device. Moreover, including certain grounding mechanisms may not be available when strictly designing a computing device to be compact and less costly. It has therefore been a challenge for designers to protect consumer devices against electrical discharges while also adhering to various design limitations.

SUMMARY

The described embodiments relate generally to consumer electronic products and more particularly to preventing damage to circuits within consumer electronic products caused by electrostatic discharge events. In one embodiment, an apparatus is set forth having a cover glass assembly and a non-conductive housing adjoined to a perimeter of the cover glass assembly. The apparatus also includes an electrostatic discharge (ESD) component abutting the cover glass assembly along a perimeter of the non-conductive housing. In this way, the ESD component is configured to prevent static charge from entering the non-conductive housing.

In another embodiment, a computing device is set forth having a cover glass assembly and a non-conductive housing configured to support a perimeter of the cover glass assembly. Additionally, the computing device can include a housing gap between formed by the configuration of the cover glass assembly and the non-conductive housing. The computing device can also include an electrostatic discharge (ESD) component configured to both overlap an end of the housing gap and abut the cover glass assembly along a perimeter of the non-conductive housing. A ground plate can be located within the non-conductive housing of the computing device. The ground plate is electrically coupled to the ESD component to provide a conductive pathway for static electricity to travel from the housing gap, along the perimeter of the non-conductive housing, to the ground plate, for protecting the computing device from damage caused by ESD.

In yet another embodiment, a method is set forth for protecting a mobile computing device from electrostatic discharge (ESD) using an ESD component material. The method can include the steps of receiving the ESD component material, and configuring the ESD component material along a perimeter of a cover glass assembly, or housing, of the mobile computing device.

Other aspects and advantages will become apparent from the following detailed description taken in conjunction with the accompanying drawings which illustrate, by way of example, the principles of the invention.

BRIEF DESCRIPTION OF THE DRAWINGS

The embodiments will be readily understood by the following detailed description in conjunction with the accompanying drawings, wherein like reference numerals designate like structural elements, and in which.

DETAILED DESCRIPTION

In the following paper, specific details are set forth to provide a thorough understanding of the concepts underlying the described embodiments. It will be apparent, however, to one skilled in the art that the described embodiments may be practiced without some or all of these specific details. In other instances, well known process steps have not been described in detail in order to avoid unnecessarily obscuring the underlying concepts.

This paper discusses techniques and apparatus for protecting a computing device, such as a mobile phone, from damage caused by an electrostatic discharge (ESD) event. Some computing devices can include a housing formed of a conductive material suitable for providing a ground. The housing can be comprised of materials such as metal, conductive plastic, or conductive composite material. One of the advantages to using metal (e.g., aluminum) for the housing is to provide a convenient common electrical grounding for internal components of the computing device, and mitigate the detrimental effects of electrostatic discharge (ESD).

However, in situations where the housing is formed of non-conductive material (e.g., plastic, ceramic, etc.), the option for utilizing the housing as a ground may not be available. Accordingly, when an ESD event occurs, static charge does not discharge at the housing, but rather moves to an interior of the computing device and potentially damages sensitive internal electrical components. In some cases, static charges can move through small gaps formed between a non-conducting housing and a cover layer (e.g., a cover glass), used to provide protection for a display of a mobile device. The gaps can be created for many reasons such as manufacturing and assembly tolerances for various components, but as a result, provide a conductive path for static charges to travel into the interior of the computing device. When the interior of the computing device includes display components such as transistors coupled by way of metallic traces, these metallic traces can collect static electrons from an ESD event causing over-voltages at one or more of the transistors, potentially causing a display of the computing device to completely fail.

Various approaches can be used to protect internal components from an ESD event. In one embodiment, an ESD blocking mechanism is used to block the transmission of static charge associated with the ESD event. When an ESD event occurs, sensitive components associated with a display (e.g., thin-film-transistors (TFT)) can be damaged due to over-voltages. The ESD blocking mechanism is configured to prevent a voltage spike at a termination point where a conductive element, such as a metallic trace, can be located within the housing. For example, an ESD path can start at non-conductive portions of a housing and terminate at metallic traces associated with display elements (e.g., TFT's). The voltages terminating at the metallic traces can result in voltage levels that exceed thresholds for various transistors rendering those transistors inoperative. In one embodiment, the ESD block can take the form of a dielectric material such as silicone disposed between the TFT layer in the display and an external surface of the computing device. The ESD block can be formed by placing the silicone around a perimeter of a cover layer used to protect a display assembly. The ESD blocking mechanism can be set, stamped, glued, or potted using any number of placement techniques (e.g., jetting) at a position that seals any gaps between the cover layer, non-conductive support, and/or housing members.

In one embodiment, the dielectric material can be doped with conductive material (e.g., silver, copper, gold, aluminum, calcium, magnesium, sodium, potassium, iron, chromium, titanium, manganese, or any other suitable conductive material or combination thereof). The doped dielectric material can then be electrically coupled to a ground plane by way of other metallic components within the housing. In one embodiment, a conductive ink layer (e.g., ink doped with conductive material) can be used to provide a conductive path. Such conductive inks can be used to enhance the aesthetic appeal of a front facing portion of the consumer electronic product, as well as electrically couple metallic structures within the housing. In this way, the conductive ink acts as a charge sink. In one embodiment, the conductive ink can be applied using a screen process. Additionally, the conductive ink can be coupled to ground traces for further grounding the consumer device and isolating the TFT layer.

These and other embodiments are discussed below with reference to FIGS. 1-10. However, those skilled in the art will readily appreciate that the detailed description given herein with respect to these figures is for explanatory purposes only and should not be construed as limiting.

Figure 1:
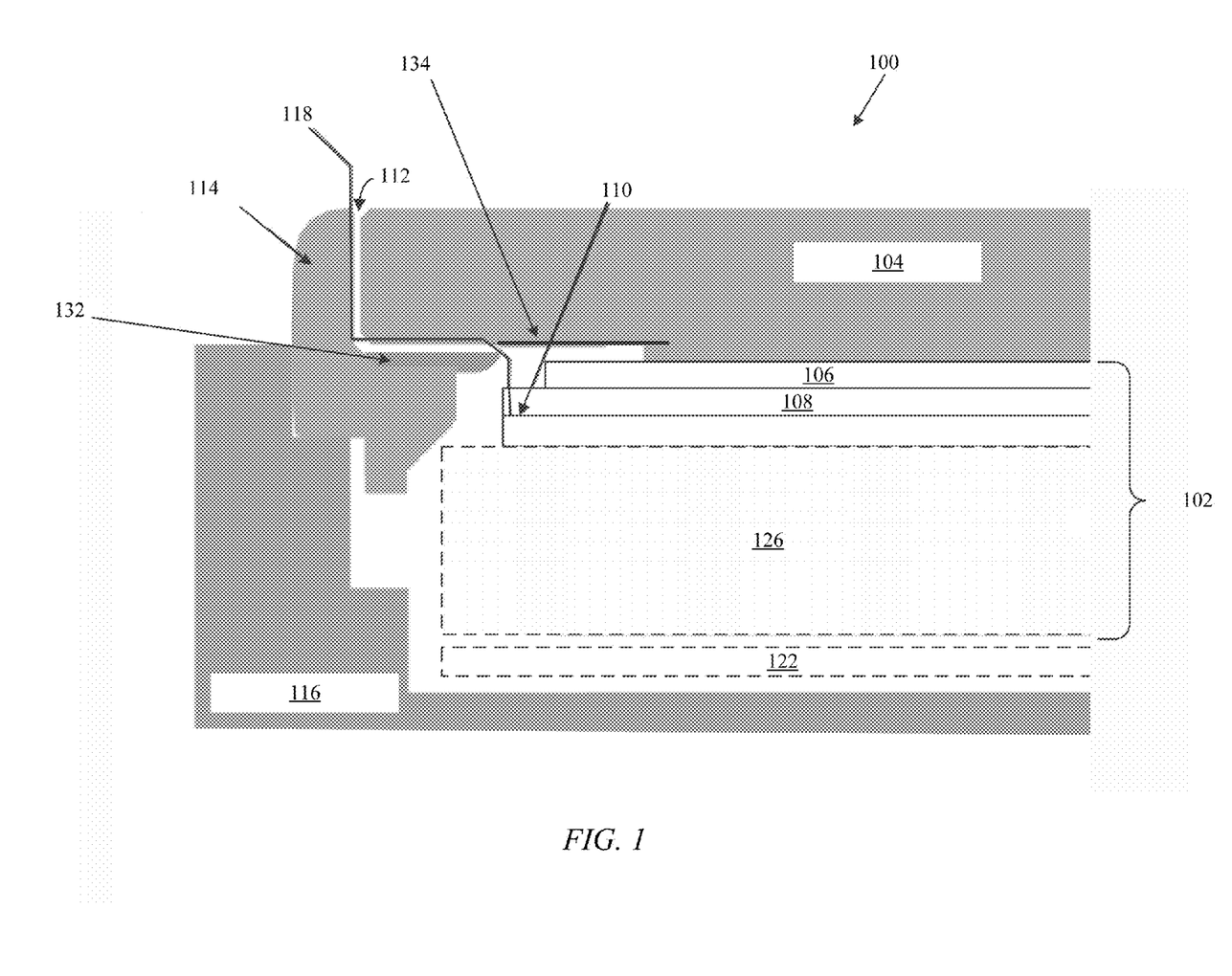
FIG. 1 shows a cross-sectional view of a display assembly and housing.

FIG. 1 shows a cross section of portion 100 of a computing device that includes display assembly 102 overlaid by cover layer 104. Display assembly 102 can take the form of a liquid crystal display (LCD) that uses thin-film-transistors (TFT) as display elements. The display assembly 102 can include a touch screen display for a user to control the computing device by touching a portion of the touch screen. In this way, cover layer 104 can be a glass layer for receiving touch commands from a user. The display assembly 102 can include a polarizer layer 106, a color filter 108, and a TFT layer 110. The TFT layer 110 can include both metallic traces (not expressly shown) that couple image elements (TFT's) to form an array for outputting images and videos. Gap 112 can result from manufacturing and assembly tolerances in between cover layer 104, support structure 114, housing 116, and adhesive 132. When support structure 114 and housing 116 are formed of non-conducting material (e.g., plastic), charge carriers can be created allowing static electricity to flow between cover layer 104, support structure 114, and adhesive 132. FIG. 1 illustrates ESD event 118 traveling via gap 112 to sensitive electrical components (e.g., the TFT layer 110) potentially causing damage due to charge accumulation at metallic traces creating voltage spikes, and thus destroying TFT layer 110. Embodiments are set forth herein for preventing such damage.

Figure 2:
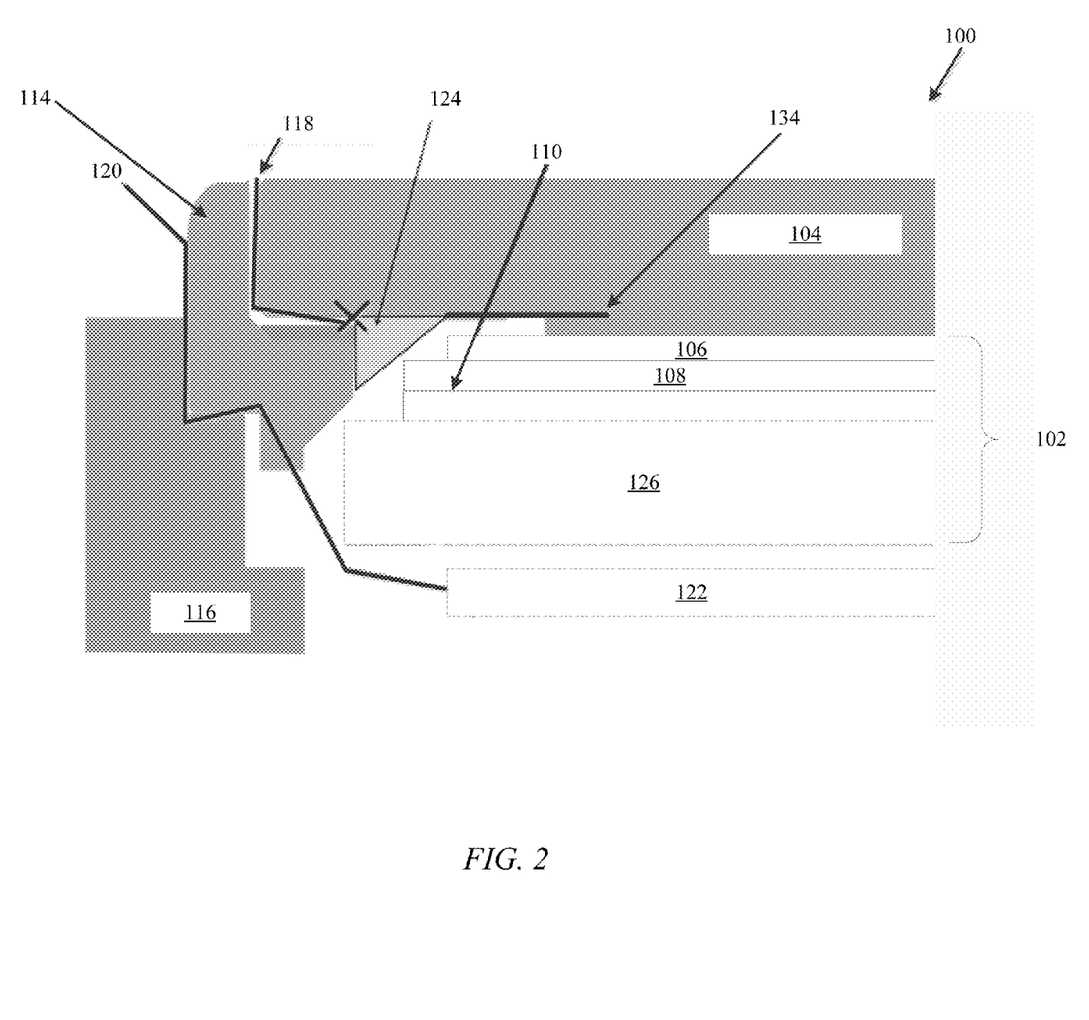
FIG. 2 shows a cross-sectional view of the display assembly and housing of FIG. 1, and a non-conducting ESD block.

FIG. 2 illustrates embodiments where ESD block 124 (also referred to as ESD component, or ESD blocking component) and conductive ink 134 are used to prevent damage from ESD events 118 and 120. As illustrated in FIG. 2, static charge associated with ESD events 118 and 120 can propagate between support structure 114, housing 116, and cover layer 104. Depending on the magnitude of ESD events 118 and 120, the static charge can collect at grounded metal object 122 or the display assembly 102. In order to further to prevent collection of charge from destroying the display assembly 102, and particularly the TFT layer 110, an ESD block 124 can be installed. In this way, both TFT layer 110 and circuitry 126 associated with display assembly 102 can be protected from ESD events 118 and 120. The ESD block 124 can be made from a non-conductive material having a high dielectric breakdown strength in order to deflect static charge. In one embodiment, ESD block 124 is formed from silicone. In some embodiments, the ESD block 124 incorporates conductive ink 134 for preventing damage during ESD events 118 and 120. In this way, the conductive ink 134 can provides a path to carry static charges away from display assembly 102 and ESD block 124. The conductive ink 134 can be an ink, adhesive, or any suitable material that will be reasonably permanent when incorporated into a computing device. Moreover, in some embodiments ESD block 124 can be electrically coupled to grounded metal object 122, providing additional means for dissipating static charges. The ESD block 124 can be configured to abut the display assembly 102 (i.e., cover glass assembly), cover layer 104, support structure 114, and/or housing 116. In some embodiments the ESD block 124 is glued to the display assembly 102, cover layer 104, support structure 114, and/or housing 116.

Figure 3:
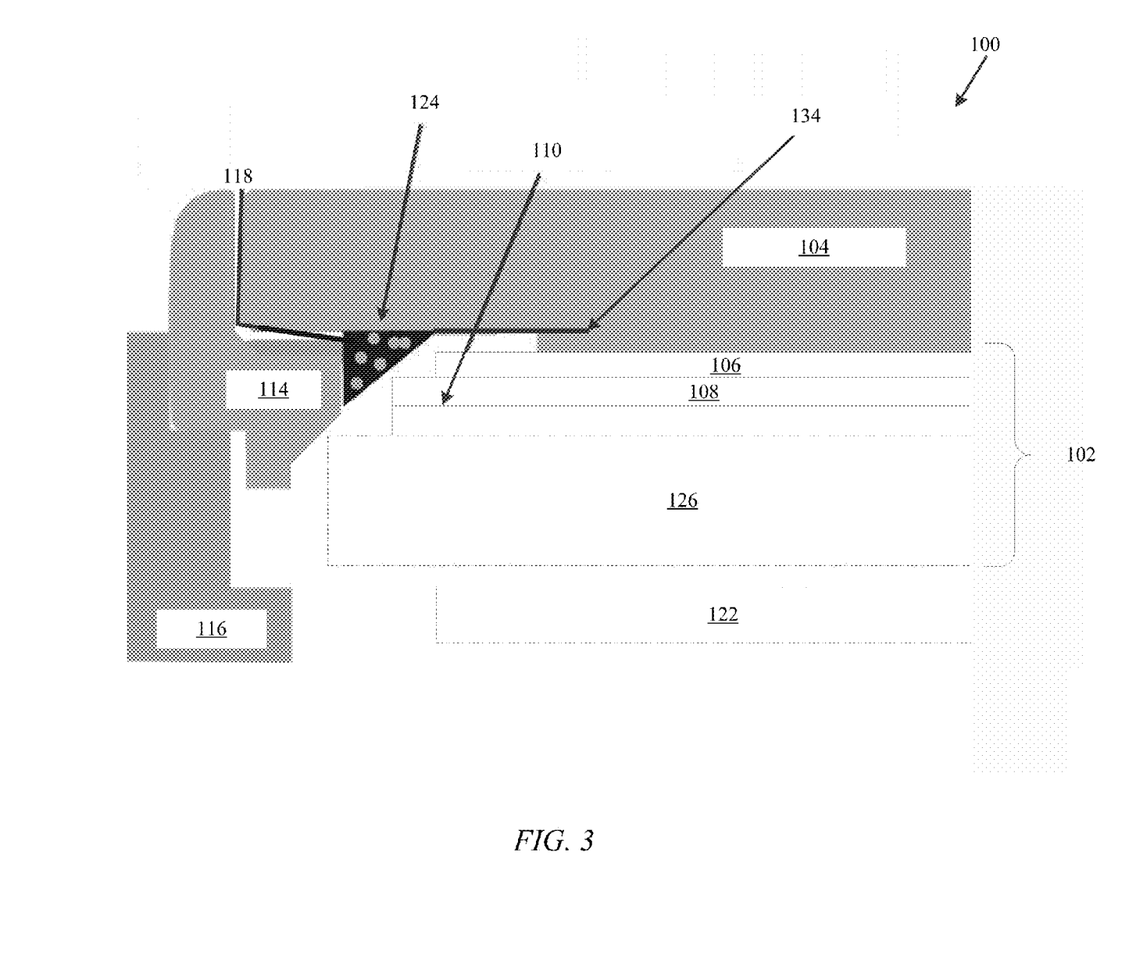
FIG. 3 shows a cross-sectional view of the display assembly and housing of FIG. 1, and an electrically conductive ESD block.

FIG. 3 shows another embodiment whereby ESD block 124 can be doped with electrically conductive particles (as listed herein) such as silver particles. In this way, ESD block 124 can be electrically coupled to a ground plane, ground plate, or other similar structure well suited for accumulating charge associated with ESD events 118 and 120. In some embodiments, the ESD block 124 can be connected to or abut conductive ink 134 to provide a conducting path to ground (i.e., a path of least resistance) for static charges to dissipate during ESD events 118 and 120.

Figure 4:
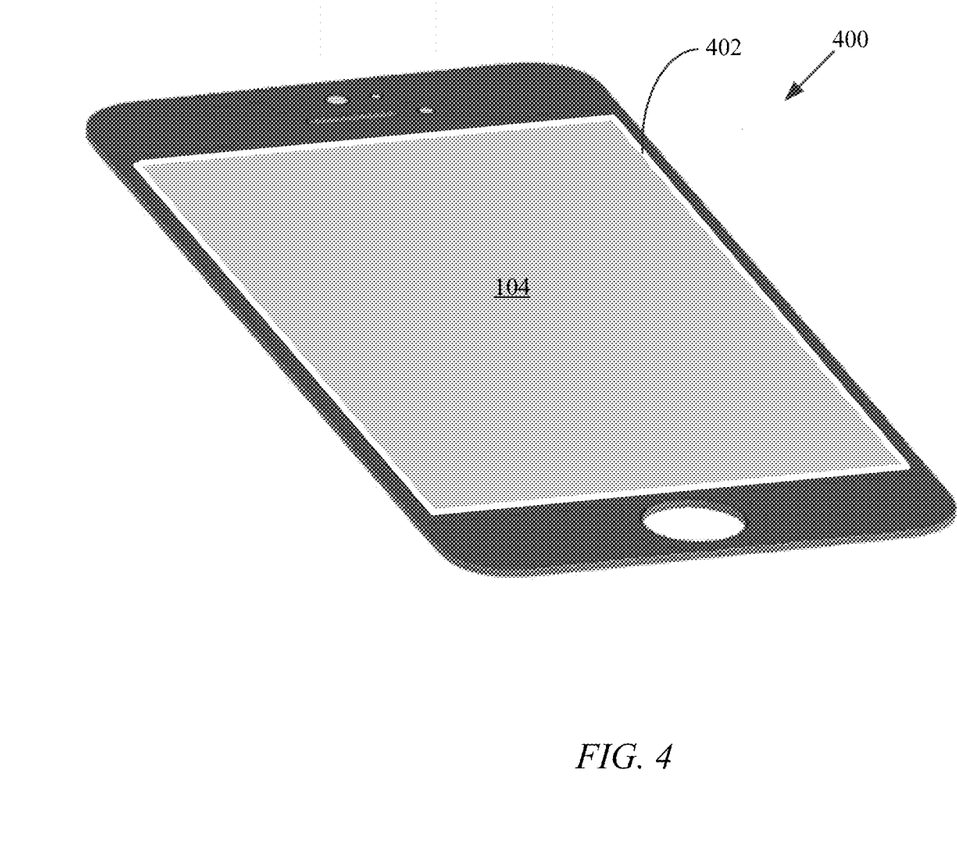
FIG. 4 shows an interior surface of a protective cover layer having a non-conductive cosmetic ink layer.
Figure 5:
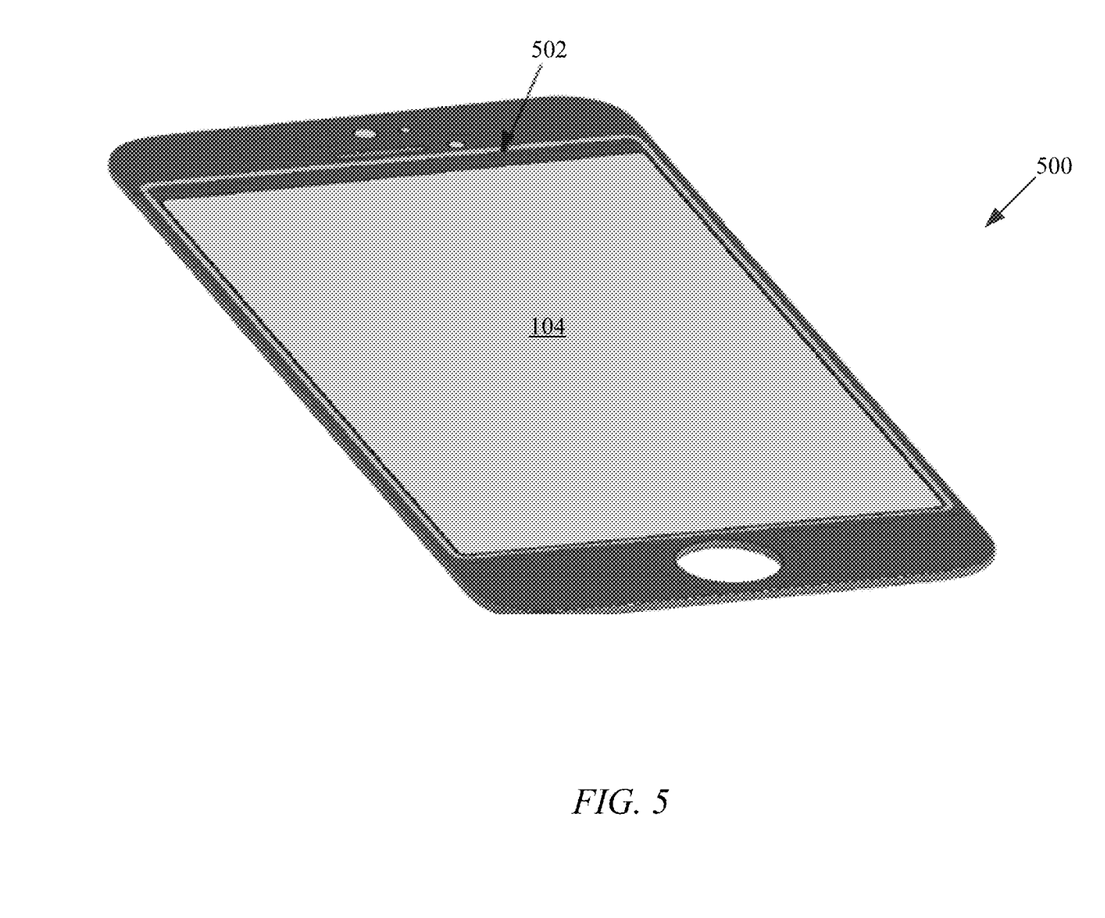
FIG. 5 shows an interior surface of a protective cover layer having a conductive cosmetic ink layer.
Figure 6:
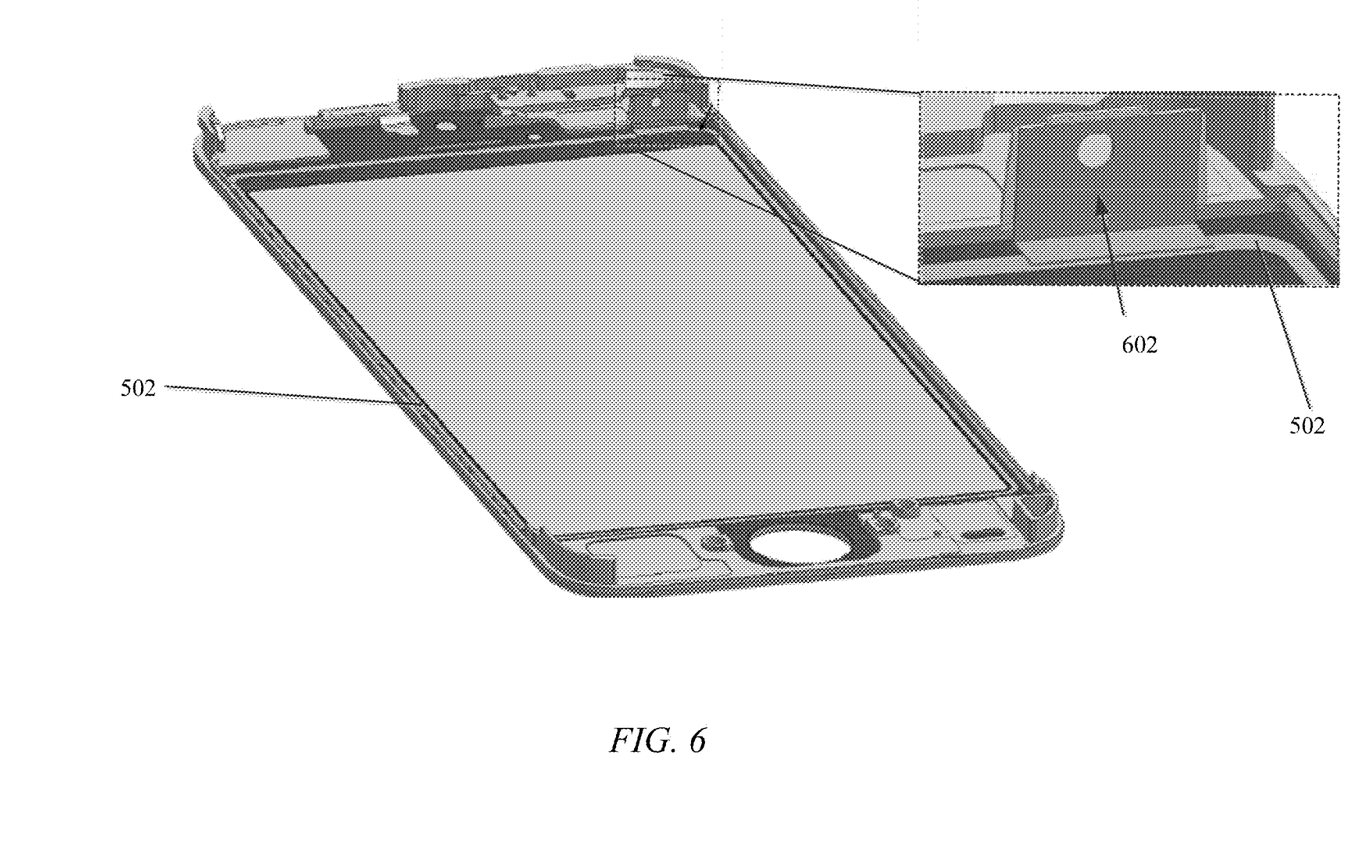
FIG. 6 shows the conductive ink layer of FIG. 5 coupled to a chassis ground in accordance with the described embodiments.

FIG. 4 shows a conventional cover glass assembly 400 having a conventional cosmetic ink 402. Cosmetic ink 402 can be used to enhance the appearance of cover glass assembly 400 by obscuring artifacts (e.g., joints) that would otherwise be visible to an end user. However, as shown in FIG. 5, an embodiment set forth herein includes a cover glass assembly 500 with the cosmetic ink 402 (which is non-conducting) replaced by conductive ink 502 providing a conducting path that can be configured anywhere around cover layer 104. In some embodiments, conductive ink 502 can be configured to provide the cosmetic features associated with cosmetic ink 402, therefore only a single layer of conductive ink 502 instead of two separate layers (cosmetic ink 402 and conductive ink 502) needs to be applied to the cover glass assembly 500. In some embodiments, as shown in FIG. 6, conductive ink 502 can be configured around and coupled to metal feature 602 such that the resulting conducting path can be grounded accordingly.

Figure 7A:
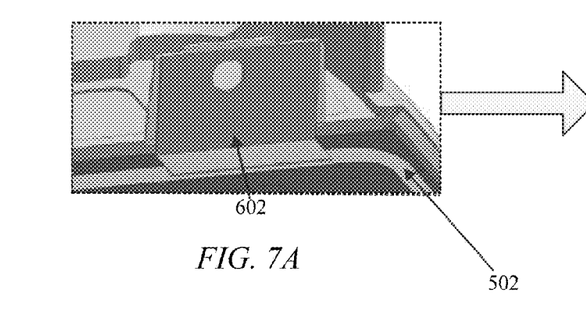
FIGS. 7A-7C show additional components used to couple the conductive ink layer to chassis ground.
Figure 7B:
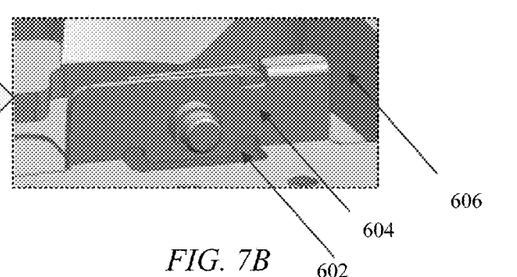
Figure 7C:
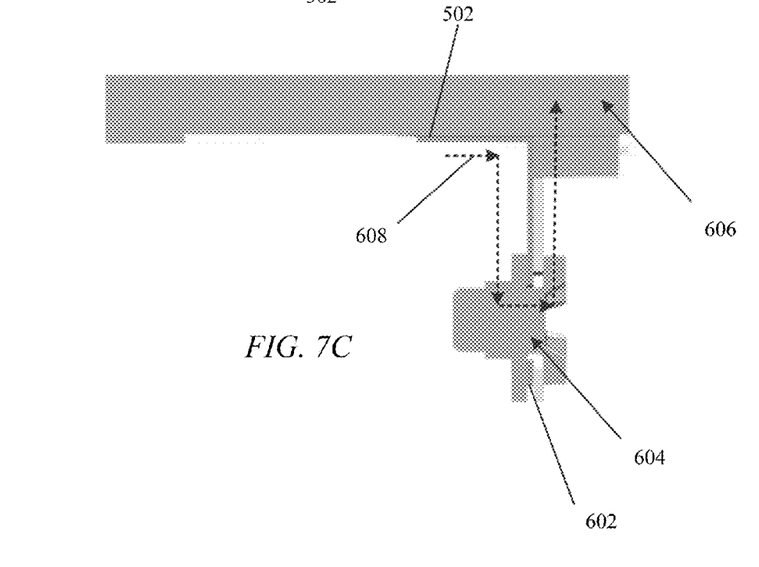

FIGS. 7A-7C illustrate the grounding of conductive ink 502. In FIG. 7A, the conductive ink 502 is electrically coupled to metal feature 602. Next, in FIG. 7B the metal feature 602 receives a mid-plate 604 that provides a conductive pathway to chassis ground 606. FIG. 7C illustrates a cross-sectional view of FIG. 7B wherein the conductive ink 502 is electrically coupled to a mid-plate 604 and the chassis ground 606. Pathway 608 is illustrated in FIG. 7C to demonstrate a possible pathway to chassis ground 606 (or a ground plate 606) from conductive ink 502. In some embodiments, conductive ink 502 can be coupled to ground features of display assembly 102 (not shown in FIGS. 7A-7C).

Figure 8:
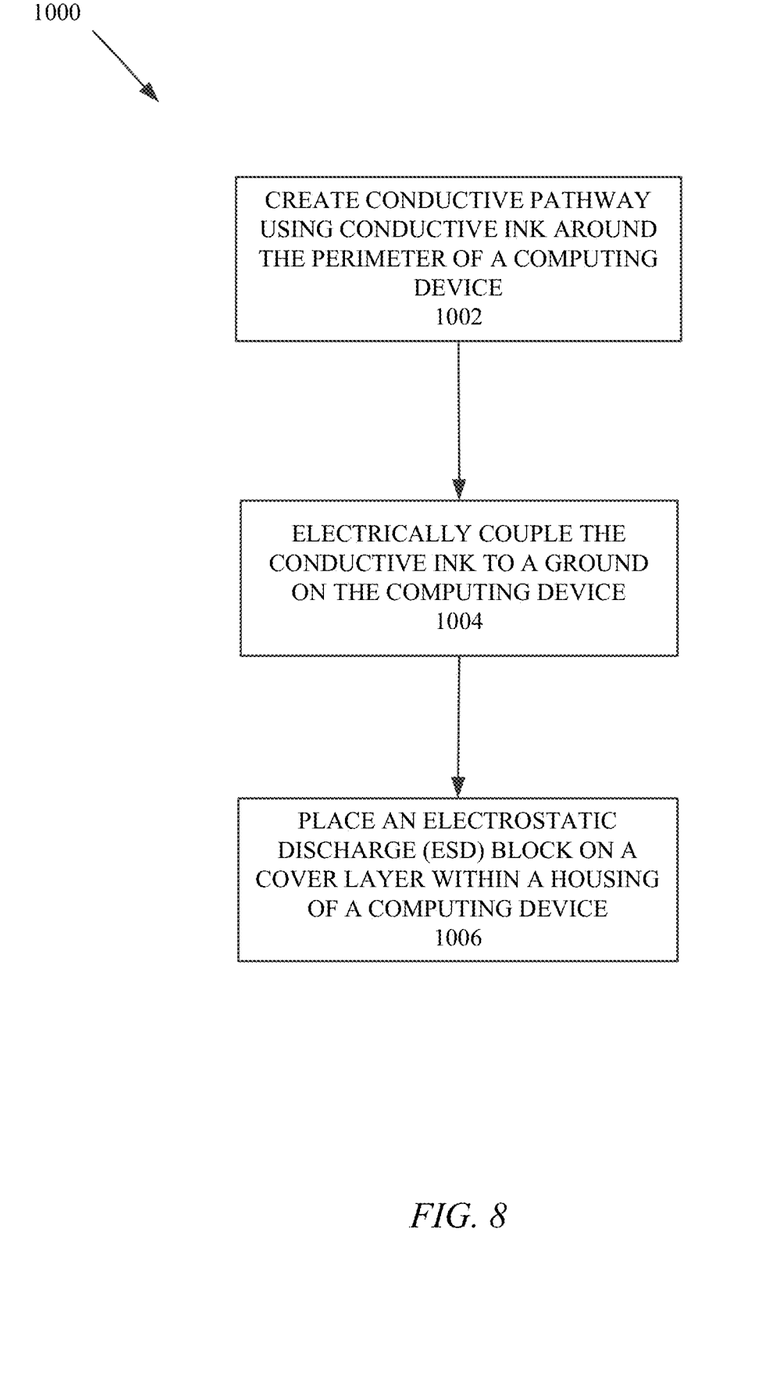
FIG. 8 is a flowchart detailing a process in accordance with the described embodiments.

FIG. 8 shows a flowchart detailing a method 1000 in accordance with the described embodiments. Method 1000 can include step 1002 for creating a conductive pathway using conductive ink around the perimeter of a display assembly. The conductive pathway can be created by configuring the conductive cosmetic ink on the display assembly during a screen printing process. At step 1004, the conductive ink can be electrically coupled to a grounded metal object on the computing device (e.g., a chassis ground). In one embodiment, grounding elements in the display assembly can be coupled to the conductive path during placement of the display assembly. The method 1000 can optionally, or exclusively, include a step 1006 of placing an ESD block on a cover layer within a housing of a computing device. The ESD block can be formed of a material having a viscosity high enough to maintain a suitable shape of ESD block within the computing device. In one embodiment, a cross section of the ESD block can be triangular, or include a suitable angle such as a right angle, in order to accommodate subsequent placement of a display assembly. The display assembly can include, for example, a polarizer layer, a color filter layer, and a TFT layer. In some embodiments, the ESD block can be rendered conductive by incorporating electrically conductive atoms (as discussed herein). In this way, the ESD block can prevent the propagation of charge carriers associated with an ESD event from collecting on certain elements within the display assembly, and potentially damaging sensitive components (such as TFT's).

The various aspects, embodiments, implementations or features of the described embodiments can be used separately or in any combination. Software, hardware or a combination of hardware and software can implement various aspects of the described embodiments. The described embodiments can also be embodied as computer readable code on a computer readable medium for controlling manufacturing operations or as computer readable code on a computer readable medium for controlling a manufacturing line. The computer readable medium is any data storage device that can store data, which can thereafter be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the invention. Thus, the foregoing descriptions of specific embodiments are presented for purposes of illustration and description. They are not intended to be exhaustive or to limit the invention to the precise forms disclosed. It will be apparent to one of ordinary skill in the art that many modifications and variations are possible in view of the above teachings.

What is claimed is:

1. An apparatus, comprising:
   a cover glass that includes a conductive ink disposed over a surface of the cover glass to define a conductive perimeter on the surface;
   a non-conductive housing comprising a support structure configured to support the cover glass and is separated from the conductive perimeter of the cover glass by a gap;
   an electronic component carried within the non-conductive housing; and
   an electrostatic discharge (ESD) component that is positioned between the electronic component and the gap, wherein the ESD component comprises a non-electrically conductive and compliant substrate having conductive particles embedded therein that prevents an external static charge from reaching the electronic component via the gap.

2. The apparatus of claim 1, wherein the ESD component comprises a dielectric material.

3. The apparatus of claim 2, wherein the dielectric material comprises silicone.

4. The apparatus of claim 1, wherein the conductive ink is electrically coupled to the ESD component to form a conductive ground path.

5. The apparatus of claim 1, wherein the ESD component is adhered to the cover glass.

6. The apparatus of claim 1, further comprising a ground metal component that is disposed in an interior of the non-conductive housing and forms a conductive ground path with the ESD component.

7. The apparatus of claim 1, wherein the conductive ink is screen printed onto the cover glass, and the cover glass forms a portion of a touch screen display of the apparatus.

8. A computing device including an interior electronic component, comprising:
   a cover glass assembly that includes a conductive ink disposed over a surface of the cover glass assembly, wherein the conductive ink forms a conductive perimeter on the surface;
   a non-conductive housing configured to support the cover glass assembly;

a gap formed between an edge of the cover glass assembly and the non-conductive housing;

an electrostatic discharge (ESD) component that is positioned between the gap and the interior electronic component and includes a non-electrically conductive and compliant substrate having embedded conductive particles to prevent an external static charge from reaching the interior electronic component via the gap; and a ground plate that is located within the non-conductive housing and is electrically coupled to the ESD component and the conductive ink for protecting the computing device from damage caused by ESD.

9. The computing device of claim 8, wherein the ESD component comprises a dielectric material.

10. The computing device of claim 8, wherein the conductive particles include silver.

11. The computing device of claim 8, wherein the conductive ink is a screen printed material.

12. The computing device of claim 8, wherein the cover glass assembly includes a liquid crystal display (LCD) and a layer of thin-film-transistors (TFTs) that the ESD component is configured to protect from the external static charge.

13. The computing device of claim 8, wherein the ESD component contacts both a housing surface of the non-conductive housing and the surface of the cover glass assembly.

14. The computing device of claim 8, wherein the ESD component is adhered to the cover glass assembly.

15. The computing device of claim 8, wherein the cover glass assembly is a touch screen display.

16. A method for protecting an electronic component disposed within a non-conductive housing of a computing device from electrostatic discharge (ESD), the method comprising:

disposing a conductive ink trace over a surface of a cover glass assembly of the computing device to form a conductive perimeter on the surface;

coupling an ESD component to the surface of the cover glass assembly to seal a gap between the cover glass assembly and the non-conductive housing, the ESD component being positioned between the electronic component and the gap; and connecting the conductive ink trace to a chassis ground of the computing device to divert the ESD to the chassis ground.

17. The method of claim 16, wherein the chassis ground is distinct from the non-conductive housing.

18. The method of claim 16, wherein the chassis ground is electrically coupled to the ESD component.

19. The method of claim 16, wherein the ESD component includes a dielectric material and conductive particles.

20. The method of claim 19, wherein the cover glass assembly is a touch screen display.

* * * * *

UNITED STATES PATENT AND TRADEMARK OFFICE
CERTIFICATE OF CORRECTION

| | | |
|---|---|---|
| PATENT NO. | : 9,489,019 B2 | Page 1 of 1 |
| APPLICATION NO. | : 14/293998 | |
| DATED | : November 8, 2016 | |
| INVENTOR(S) | : Miguel C. Christophy et al. | |

It is certified that error appears in the above-identified patent and that said Letters Patent is hereby corrected as shown below:

In the Claims

Column 6, Line 32 (Claim 1, Line 6): "configured to support the cover glass and is separated" should read -- configured to support the cover glass and separated --.

Signed and Sealed this
Twenty-seventh Day of November, 2018

Andrei Iancu
*Director of the United States Patent and Trademark Office*